United States Patent
Jeng et al.

(10) Patent No.: US 6,326,269 B1
(45) Date of Patent: Dec. 4, 2001

(54) METHOD OF FABRICATING SELF-ALIGNED MULTILEVEL MASK ROM

(75) Inventors: Pei-Ren Jeng; C. Y. Lee, both of Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/731,929

(22) Filed: Dec. 8, 2000

(51) Int. Cl.$^7$ ................................................ H01L 21/8236
(52) U.S. Cl. ........................... 438/278; 438/257; 438/275
(58) Field of Search ..................................... 438/262, 275, 438/278, 301, 592, 597, 257, 259, 261, 264, 266

(56) References Cited

U.S. PATENT DOCUMENTS

| | | | |
|---|---|---|---|
| 5,707,897 | * | 1/1998 | Lee et al. ............................. 438/257 |
| 5,877,074 | * | 3/1999 | Jeng et al. ........................... 438/592 |
| 6,146,949 | * | 11/2000 | Wu ...................................... 438/275 |

* cited by examiner

Primary Examiner—David Nelms
Assistant Examiner—Phuc T. Dang

(57) ABSTRACT

A method of fabricating self-aligned multilevel mask read only memory (ROM). The method can improve the process window to reduce process difficulty by utilizing the self-aligned implantation. Moreover, by utilizing the connection between the word line and the gate and implantation of the ROM code with self-aligned implatiation to increase the difference between the threshold voltages of different gates, and therefore, multilevel cell transistors with for the mask ROM with multilevel threshold voltages are formed to times the capacity of the mask ROM.

18 Claims, 5 Drawing Sheets

METHOD OF FABRICATING SELF-ALIGNED MULTILEVEL MASK ROM

FIELD OF THE INVENTION

The present invention relates to a method of fabricating a mask read only memory (ROM), and more particularly to a method of fabricating a high density mask ROM with multilevel cell transistor by using self-aligned code implantation.

BACKGROUND OF THE INVENTION

Mask ROM is generally made from a number of cell transistors, each serving as a memory unit. When programming is required, ions are implanted into the channel region of selected memory cells so that threshold voltage of these cells is modified. The 'on' or 'off' state of each memory cell is thus set. In general, a memory cell is created whenever a word line (WL) crosses over a bit line (BL). The memory cell is formed in the word line covered area between two neighboring bit lines. Each memory cell is capable of storing a binary bit of data, either in a logic state of '0' or '1' depending on whether the channel region of the memory cell is implanted or not.

However, when the generation of the mask ROM fabrication is migrated into deep-sub-micro semiconductor process, the higher integration of the integrated circuit, the smaller size of the semiconductor device. While ions implanted into the channel region of selected memory cells, location of the implanting region may have misalignment, so that shifts the threshold voltage of transistors. If location of the implanting region is misaligned, may be shifted to the direction of word line or bit line, this will directly cause data storage error of the ROM cell and disturb the neighboring implanting regions to affect operation property of the memory cell, especially in the shift of word line direction. A conventional way to resolve the problem is using a phase-shift mask (PSM) to program the ROM code. However, this will greatly increase manufacture cost and time so that PSM is not economic.

In addition, ions are implanted just only one time in programming two-level mask ROM so that the cell transistor only has two cases, ion implanted or not. This results each cell transistor of the two-level mask ROM is indicated to have binary signal of "1" or "0". When memory capacity of two-level mask ROM is required larger, a mount of cell transistors in the two-level mask ROM is increased, so that reducing the integration of the two-level mask ROM, and further reducing yield of the cell transistors.

SUMMARY OF THE INVENTION

Therefore, the present invention provides a method of fabricating a self-aligned multilevel mask read only memory (ROM). The method of the present invention can prevent shift of the threshold voltage causing from misalignment of ion implantation. By whether connecting between the gate and the word line and implanting ROM code to enlarge difference of gate threshold voltage, a multilevel mask ROM is therefore formed to times the memory capacity.

The present invention provides a method of fabricating a mask read only memory (ROM), comprising: forming a gate oxide layer on a substrate; forming a polysilicon layer and a silicon nitride layer in sequence on the substrate; defining the silicon nitride layer and the polysilicon layer; performing a doping process to form a buried bit line in the substrate by using the silicon nitride layer and the polysilicon layer as a mask; defining the silicon nitride layer and the polysilicon layer to form a plurality of stacked gate layers; forming a plurality of gate spacers around and on the sidewall of the stacked gate layers; forming a silicon oxide layer over the substrate; removing portion of the silicon oxide layer until exposing the top of the silicon nitride layer; forming a first patterned photoresist layer on the substrate to cover parts of the silicon nitride layer; removing the exposed silicon nitride layer by using the first patterned photoresist layer as a mask; removing the first patterned photoresist layer; forming a second patterned photoresist layer; performing an ion implantation process to form a doped region in the substrate under the exposed polysilicon layer by using the second patterned photoresist layer; removing the second patterned photoresist layer; and forming a conductive layer on the substrate to electrically connect to the exposed polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
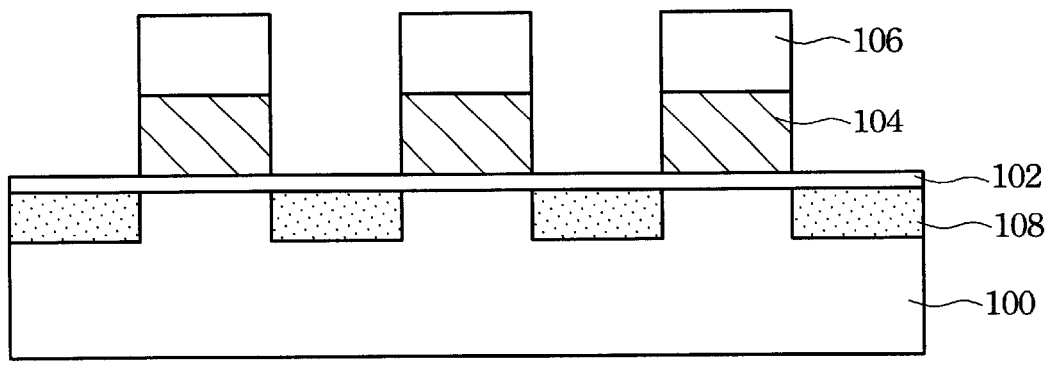
FIGS. 1A–1I are schematic, cross-sectional views of illustrating fabrication of the mask ROM of the preferred embodiment in accordance with the present invention.

Referring to FIG. 1A, a gate layer 102 is formed on a semiconductor substrate 100. A gate conductive layer and a gate cap layer, such as polysilicon layer 104 and silicon nitride layer 106, are formed on the substrate in sequence by chemical vapor deposition (CVD). The illustrated embodiment is described with the polysilicon layer 104 and silicon nitride layer 106 as an example.

Figure 2:
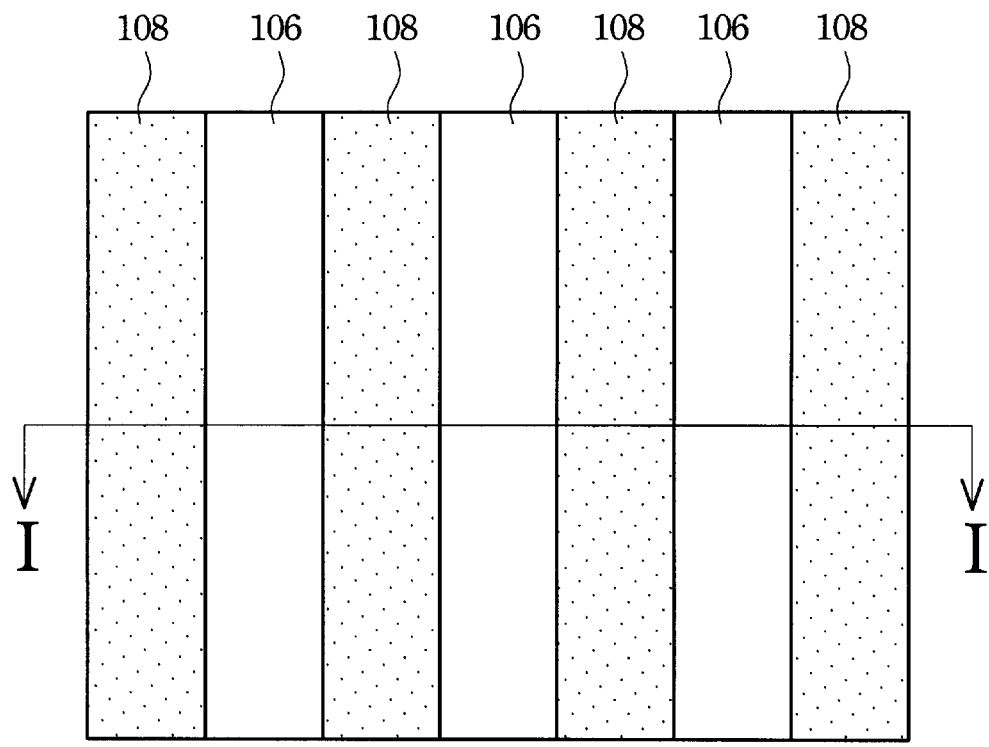
FIG. 2 is illustrating fabrication of the mask ROM of the preferred embodiment in accordance with the present invention, wherein the cross-sectional line I—I is corresponding to the FIG. 1A.

Referring to FIG. 2, it is a schematic, top view of the preferred embodiment in accordance with the present invention. FIG. 1A is a cross-sectional view corresponding to the cross-sectional line I—I in the FIG. 2. Referring to FIG. 1A and FIG. 2, the silicon nitride layer 106 and polysilicon layer 104 are defined by conventional photolithography and etch process to form a plurality of parallel, linear silicon nitride layer 106 and polysilicon layer 104, which are stacked as shown in the silicon nitride layer 106 of FIG. 2. A doping process, such as an ion implantation, is performed to dope the substrate 100 and then a plurality of linear doped region 108 are formed in the substrate 100 between the neighbored linear silicon nitride layers 106.

The doped region 108 is subsequently activized to serve as a buried bit line by annealing process, as shown in FIG. 2.

Figure 1B:
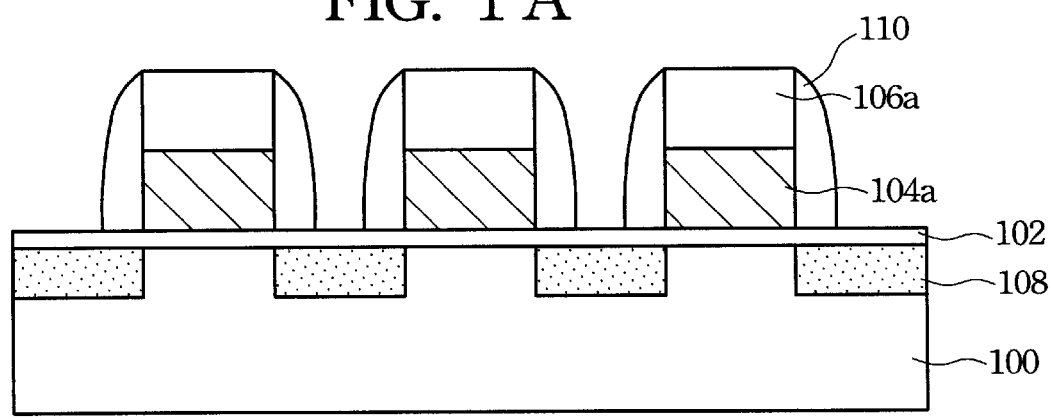
Figure 3:
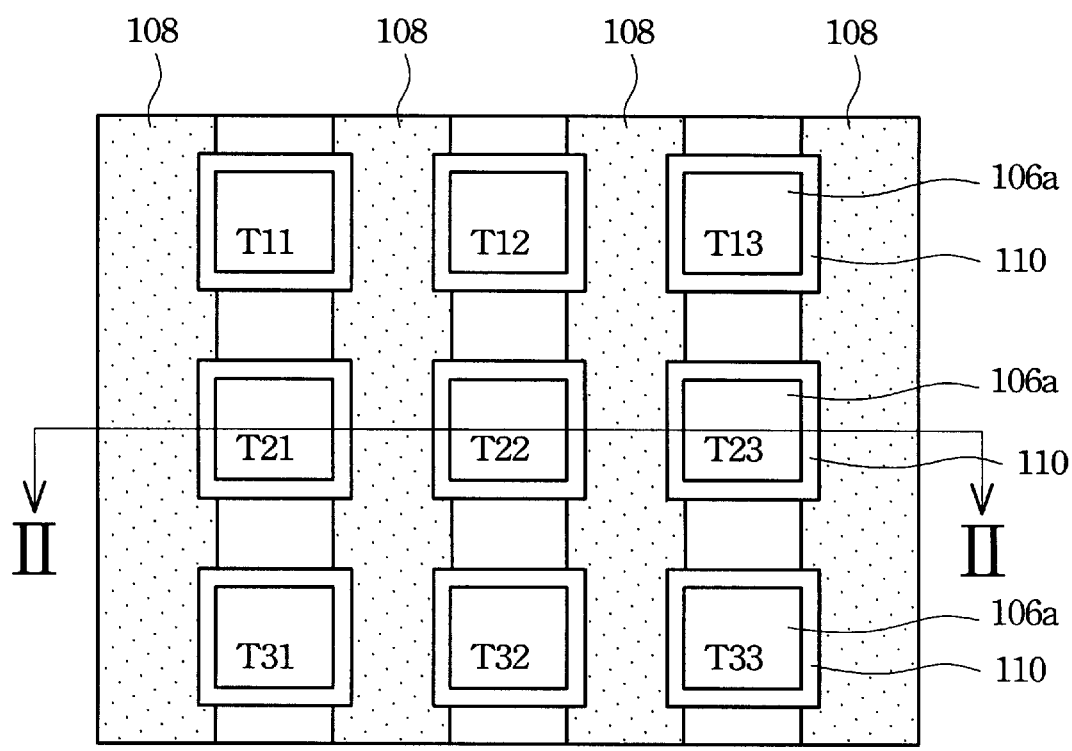
FIG. 3 is illustrating fabrication of the mask ROM of the preferred embodiment in accordance with the present invention, wherein the cross-sectional line II—II is corresponding to the FIG. 1B.

Referring to FIGS. 1B and 3, FIG. 3 is a schematic, top view of the preferred embodiment in accordance with the present invention, and FIG. 1B is a cross-sectional view corresponding to the cross-sectional line I—I in the FIG. 3. The linear silicon nitride layer 106 and polysilicon layer 104 are defined again to form a plurality of stacked gate layers by conventional photolithography and etch process, as shown in the block region for transistors $T_{11}$~$T_{33}$. In FIG. 1B, the stacked gate layers are stacked with silicon nitride layer 106a and polysilicon layer 104a. A plurality of gate spacers 110 are then formed on the sidewall of the stacked gate layers, and the gate spacers 110 are around the stacked gate layers, as shown in FIG. 3. The gate spacers 110 can be formed with the following exemplary steps. A material of the gate spacers 110, such as silicon oxide, is formed by, for example, chemical vapor deposition (CVD) over the substrate 100. Undesired portion of the silicon oxide layer is then removed by anisotropic etching process to leave the gate spacers 110 on the sidewall of the stacked gate layers.

Figure 1C:
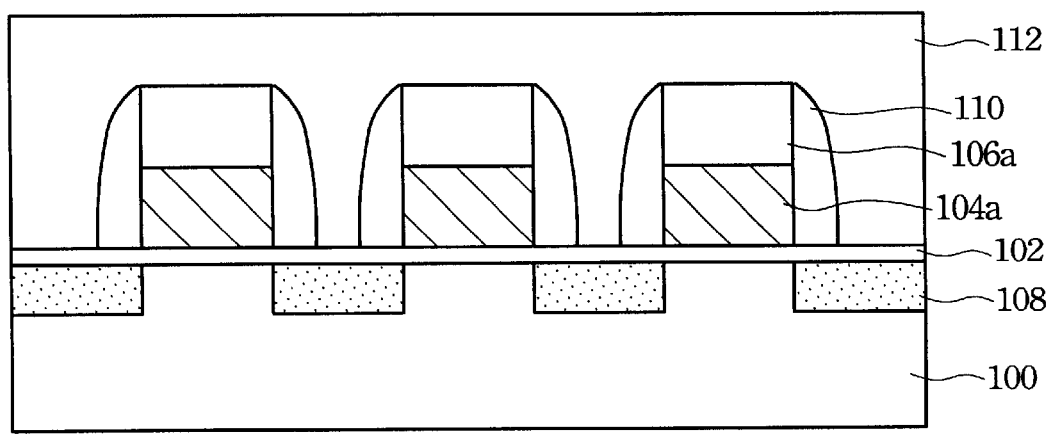
Figure 1D:
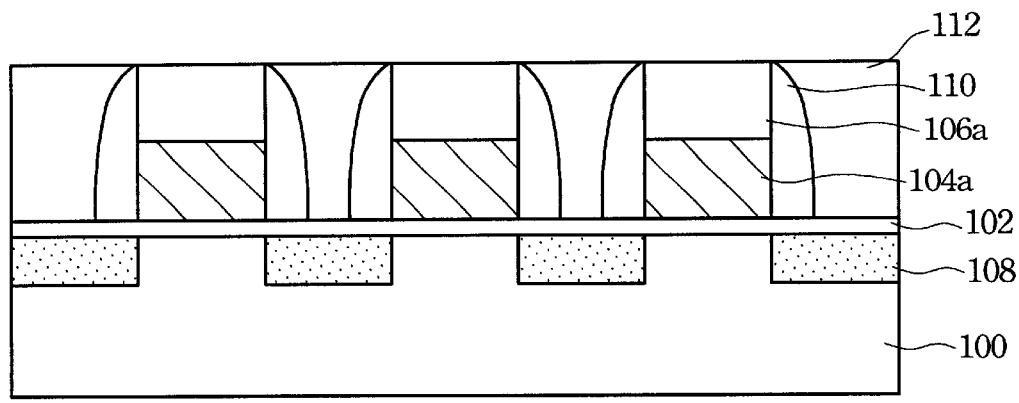

Referring to FIG. 1C, an insulating layer is formed over the substrate 100 and fill the gap between the stacked gate layers. The insulating layer is preferably a high-density plasma (HDP) silicon oxide layer 112 formed by HDP-CVD. Referring to FIG. 1D, a planarization process is carried out to remove undesired portion of the HDP silicon oxide layer 112 until exposing the top of silicon nitride layer 106a. The planarization process is preferably performed with chemical mechanical polishing (CMP), and other process, such as etch back process, also can be used.

Figure 1E:
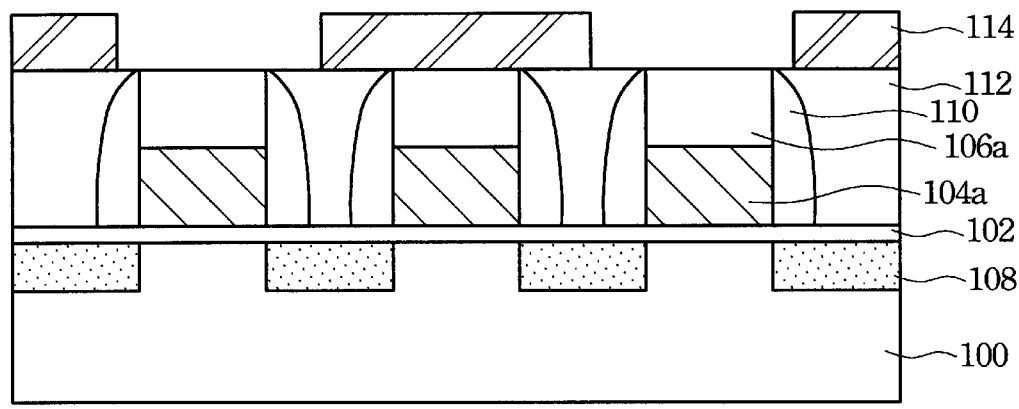

Referring to FIG. 1E, a first patterned photoresist layer 114 is formed on the substrate 100 by a sequence of steps, such as coating, exposing and developing, etc. The patterned photoresist layer 114 includes a pattern of first read only memory (ROM) code, and first ROM code is programmed into cell transistors by utilizing the patterned photoresist layer 114. For example, the patterned photoresist layer 114 covers the transistor $T_{22}$ and exposes the transistors $T_{21}$ and $T_{23}$.

Figure 1F:
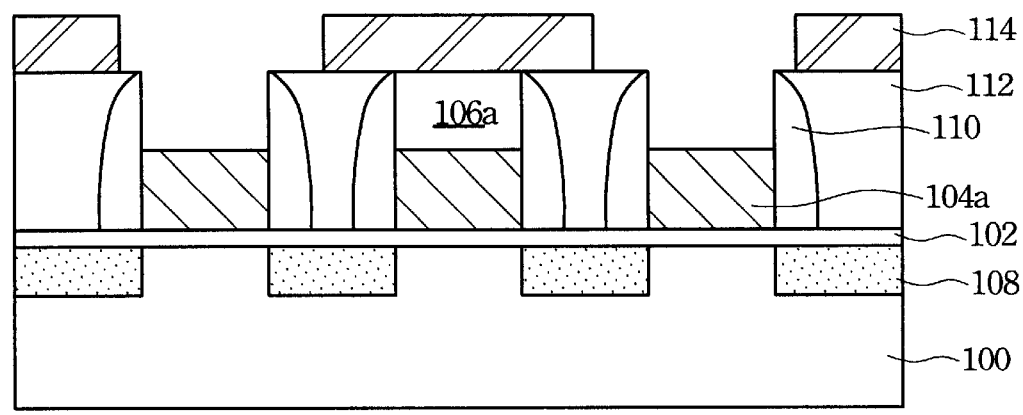

Referring to FIG. 1F, by using the patterned photoresist layer 114 as a mask, exposed parts of the silicon nitride layer 106a are then removed by such as wet etching to expose underlying parts of the polysilicon layer 104a. By removing the silicon nitride layer 106a to control a connection between the exposed polysilicon layer 104a and subsequently formed conductive layer (for word line) to program the ROM code into cell transistors. For example, in the transistor $T_{22}$, the silicon nitride layer 106a is not removed so that the polysilicon layer 104a of transistor $T_{22}$ cannot connect to the subsequently formed word line conductive layer. Therefore, the transistor $T_{22}$ will be at "OFF" state, and thereby "0" of the ROM code is programmed into the cell transistor $T_{22}$.

Figure 1G:
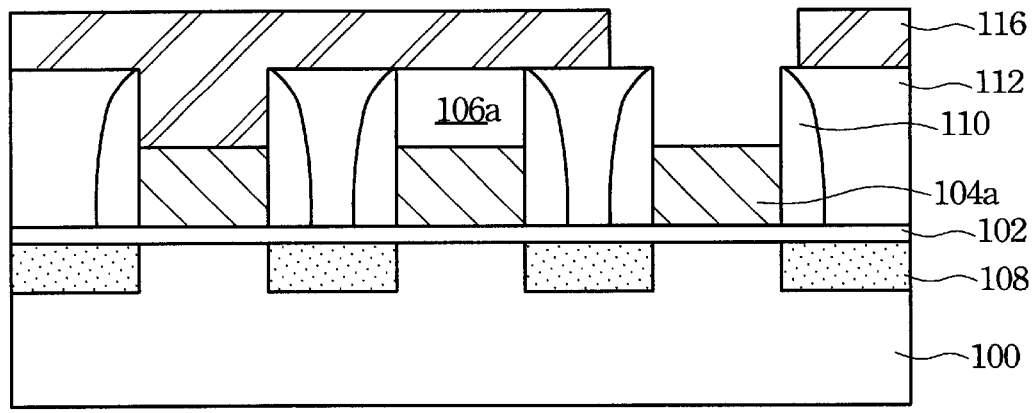

Referring to FIG. 1G, a second patterned photoresist layer 116 is formed on the substrate 100 by a sequence of steps, such as coating, exposing and developing, etc. The patterned photoresist layer 116 includes a pattern of second ROM code, and second ROM code is programmed into cell transistors by utilizing the patterned photoresist layer 116. For example, the patterned photoresist layer 116 covers the transistor $T_{21}$, and $T_{22}$ and exposes the transistors $T_{23}$.

Figure 1H:
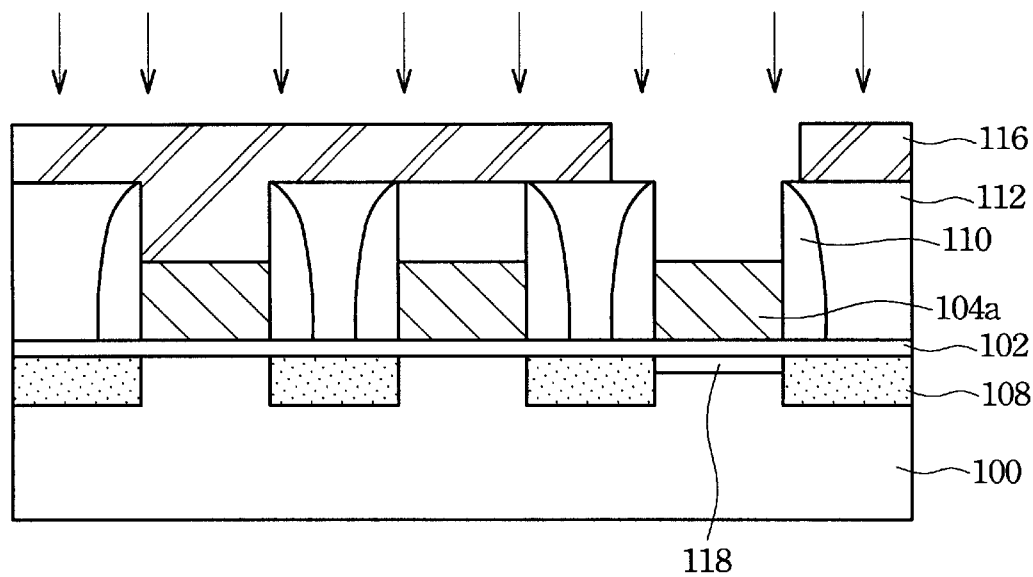

Referring to FIG. 1H, by using the patterned photoresist layer 116 as a mask, an ion implantation process is performed to dope the ions into the substrate 100 to form a plurality of doped regions 118 in the substrate 100 underlying the exposed parts of the polysilicon layer 104a, such as of transistor $T_{23}$. Since the ions doped into the substrate 100 can be "self-aligned" so that the patterned photoresist layer 116 serving as a mask can have a larger opening for ROM code, and therefore increase process window of the photolithography process. The problem of shift of threshold voltage causing from mask misalignment to result device operation default can be prevent. Moreover, because the doped region 118 will modify the threshold voltage of the doped region 118, by forming the doped regions 118 for the cell transistors, the threshold voltage of the doped cell transistors will be increased to program ROM code into cell transistors. For example, the transistor $T_{23}$ has a doped region 118 and the transistor $T_{21}$ does not, so that the threshold voltage of the transistor $T_{23}$ will be larger than the transistor $T_{21}$. While an external voltage between the threshold voltages of the transistors $T_{21}$, and $T_{23}$ is applied to the transistors $T_{21}$ and $T_{23}$, only the transistor $T_{23}$ is turned on, so that the transistors $T_{21}$ and $T_{23}$ is programmed again. By forming multilevel of the threshold voltage, the capacity of the memory is redoubled. The patterned photoresist layer 116 is then removed. Two ROM codes are used as an example. Furthermore, if more ROM codes are needed to program, the steps from FIG. 1G–1H can be repeated to form desired multilevel mask ROM.

Figure 1I:
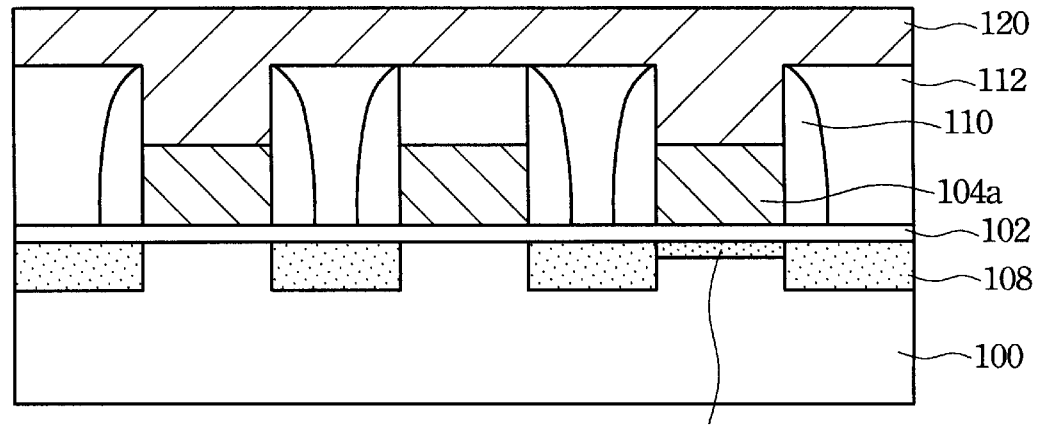
Figure 4:
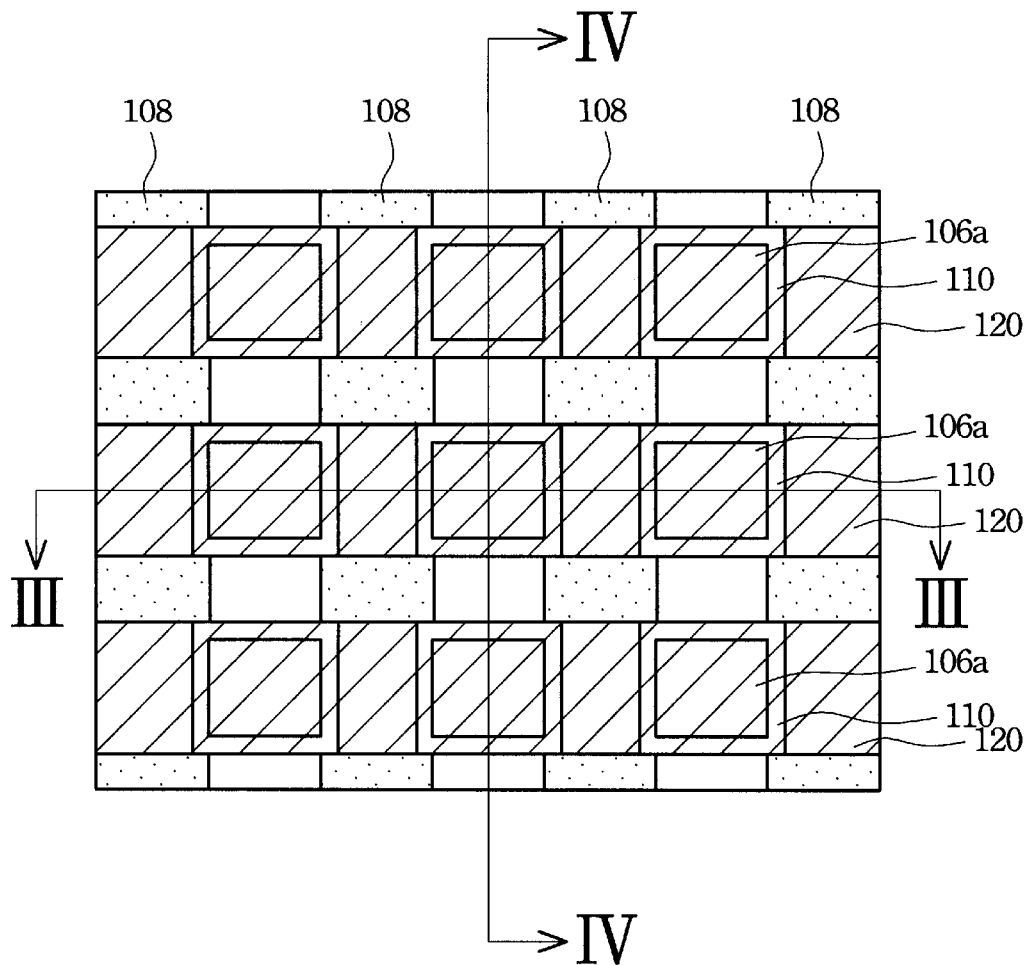
FIG. 4 is illustrating fabrication of the mask ROM of the preferred embodiment in accordance with the present invention, wherein the cross-sectional line III—III is corresponding to the FIG. 1I.
Figure 5:
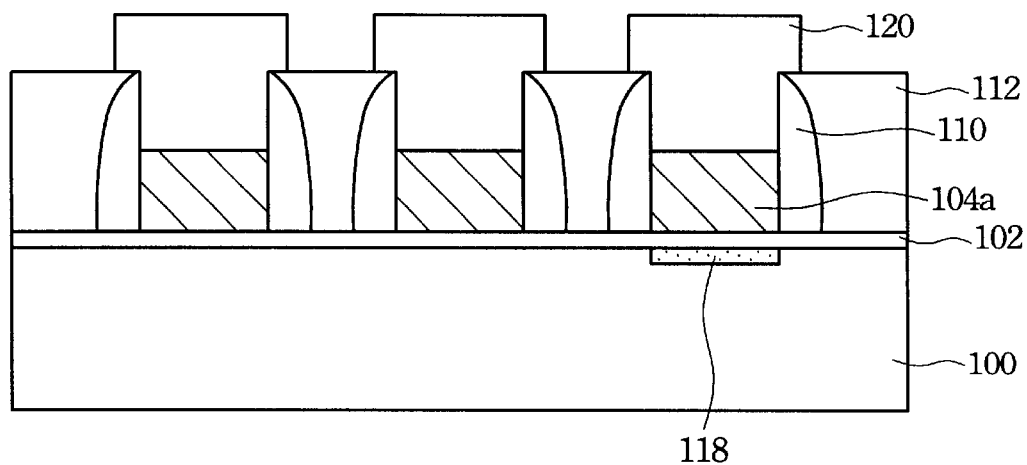
FIG. 5 is corresponding to the cross-sectional line IV—IV of the FIG. 4.

Referring to FIG. 1I, a conductive layer 120 is formed over the substrate 100 and electrically connected to the exposed polysilicon layer 104a. The conductive layer 120 is the defined by conventional photolithography and etch process to form parallel word lines across the buried bit lines 108, as shown in FIG. 4. Referring to FIG. 5, it is a schematic, cross-sectional view corresponding to the cross-sectional line IV—IV of FIG. 4. The conductive word lines 120 are arranged as shown in FIG. 5. A material of the conductive word lines is preferably made of metal, such as tungsten (W) to reduce electrical resistance and improve the operation speed. A barrier metal layer such as TiN can be selectively formed to improve adhesion between the polysilicon layer 104a and the conductive layer 120 in prior to forming the conductive layer 120.

According to above description, the present invention provides a method of fabricating a self-aligned multilevel mask read only memory (ROM). The method of the present invention can prevent shift of the threshold voltage causing from misalignment of ion implantation. By whether connecting between the gate and the word line and implanting ROM code to enlarge difference of gate threshold voltage, a multilevel mask ROM is therefore formed to times the memory capacity.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a mask read only memory (ROM), comprising:

forming a gate oxide layer on a substrate;

forming a polysilicon layer and a silicon nitride layer in sequence on the substrate;

defining the silicon nitride layer and the polysilicon layer;

performing a doping process to form a buried bit line in the substrate by using the silicon nitride layer and the polysilicon layer as a mask;

defining the silicon nitride layer and the polysilicon layer to form a plurality of stacked gate layers;

forming a plurality of gate spacers around and on the sidewall of the stacked gate layers;

forming a silicon oxide layer over the silicon nitride layer, the polysilicon layer and the substrate;

removing portion of the silicon oxide layer until exposing the top of the silicon nitride layer;

forming a first patterned photoresist layer on the substrate to cover parts of the silicon nitride layer, wherein the first patterned photoresist layer includes a pattern of first ROM code programmed with removing the exposed silicon nitride layer;

removing the exposed silicon nitride layer by using the first patterned photoresist layer as a mask;

removing the first patterned photoresist layer;

forming a second patterned photoresist layer;

performing an ion implantation process to form a doped region in the substrate under the exposed polysilicon layer by using the second patterned photoresist layer as a mask;

removing the second patterned photoresist layer; and forming a conductive layer on the substrate to electrically connect to the exposed polysilicon layer.

2. The method according to claim 1, wherein a material of the gate spacers comprises silicon oxide.

3. The method according to claim 1, wherein the silicon oxide layer comprises a high-density plasma (HDP) silicon oxide layer.

4. The method according to claim 1, wherein removing portion of the silicon oxide layer until exposing the top of the silicon nitride layer comprises using chemical mechanical polishing (CMP).

5. The method according to claim 1, wherein the second patterned photoresist layer includes a pattern of second ROM code.

6. The method according to claim 5, wherein the second ROM code is programmed with forming the doped region.

7. The method according to claim 1, wherein the ion implantation process is a self-aligned ion implantation process.

8. The method according to claim 1, wherein a material of the conductive layer comprises tungsten.

9. A method of fabricating a mask read only memory (ROM), comprising:

forming a gate oxide layer, a gate conductive layer and a gate cap layer in sequence on a substrate;

defining the gate cap layer and the gate conductive layer;

performing a first doping process to form a buried bit line in the substrate by using the gate cap layer and the gate conductive layer as a mask;

defining the gate cap layer and the gate conductive layer to form a plurality of stacked gate layers;

forming a plurality of gate spacers around and on the sidewall of the stacked gate layers;

forming an insulating layer over the gate cap layer, the gate conductive layer and the substrate;

removing portion of the insulating layer until exposing the top of the gate cap layer;

forming a first patterned photoresist layer on the substrate to cover parts of the gate cap layer, wherein the first patterned photoresist layer includes a pattern of first ROM code programmed with removing the exposed gate cap layer;

removing the exposed gate cap layer by using the first patterned photoresist layer as a mask;

removing the first patterned photoresist layer;

forming a second patterned photoresist layer;

performing a second doping process to form a doped region in the substrate under the exposed gate conductive layer by using the second patterned photoresist layer as a mask;

removing the second patterned photoresist layer; and forming a conductive layer on the substrate to electrically connect to the exposed gate conductive layer.

10. The method according to claim 9, wherein a material of the gate conductive layer comprises polysilicon.

11. The method according to claim 9, wherein a material of the gate cap layer comprises silicon nitride.

12. The method according to claim 9, wherein a material of the gate spacers comprises silicon oxide.

13. The method according to claim 9, wherein the insulating layer comprises a high-density plasma (HDP) silicon oxide layer.

14. The method according to claim 9, wherein removing portion of the silicon oxide layer until exposing the top of the gate cap layer comprising using chemical mechanical polishing (CMP).

15. The method according to claim 9, wherein the second patterned photoresist layer includes a pattern of second ROM code.

16. The method according to claim 15, wherein the second ROM code is programmed with forming the doped region.

17. The method according to claim 9, wherein the first doping process is a self-aligned ion implantation process.

18. The method according to claim 9, wherein a material of the conductive layer comprises tungsten.

* * * * *